(12) United States Patent
Bangsaruntip et al.

(10) Patent No.: US 9,337,264 B2
(45) Date of Patent: May 10, 2016

(54) PROCESS FOR FORMING A SURROUNDING GATE FOR A NANOWIRE USING A SACRIFICIAL PATTERNABLE DIELECTRIC

(71) Applicant: GLOBALFOUNDRIES INC., Grand Cayman (KY)

(72) Inventors: Sarunya Bangsaruntip, Mount Kisco, NY (US); Guy Cohen, Mohegan Lake, NY (US); Michael A. Guillorn, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/664,435

(22) Filed: Mar. 20, 2015

(65) Prior Publication Data

US 2015/0194487 A1 Jul. 9, 2015

Related U.S. Application Data

(62) Division of application No. 12/830,514, filed on Jul. 6, 2010, now Pat. No. 9,029,834.

(51) Int. Cl.
*H01L 29/786* (2006.01)
*H01L 29/06* (2006.01)
(Continued)

(52) U.S. Cl.
CPC .............. *H01L 29/0669* (2013.01); *B82Y 10/00* (2013.01); *H01L 29/0649* (2013.01); *H01L 29/0665* (2013.01); *H01L 29/165* (2013.01); *H01L 29/42392* (2013.01);
(Continued)

(58) Field of Classification Search
CPC ............ H01L 29/0665; H01L 29/0673; H01L 29/66439; H01L 29/775; H01L 29/78696

USPC ............ 257/324, 329, 347, 365; 438/289, 275
See application file for complete search history.

(56) References Cited

U.S. PATENT DOCUMENTS 5,965,914 A 10/1999 Miyamoto
6,251,763 B1 6/2001 Inumiya et al.
(Continued)

OTHER PUBLICATIONS

I.-B. Baek et al., "Electron beam lithography patterning of sub-10 nm line using hydrogen silsesquioxane for nanoscale device applications," J. Vac. Sci. Technol. B, vol. 23, pp. 3120-3123 (2005).
(Continued)

*Primary Examiner* — Eva Y Montalvo
*Assistant Examiner* — David Goodwin
(74) *Attorney, Agent, or Firm* — Michael LeStrange; Andrew M. Calderon; Roberts, Mlotkowski, Safran & Cole PC

(57) ABSTRACT

Techniques for defining a damascene gate in nanowire FET devices are provided. In one aspect, a method of fabricating a FET device is provided including the following steps. A SOI wafer is provided having a SOI layer over a BOX. Nanowires and pads are patterned in the SOI layer in a ladder-like configuration. The BOX is recessed under the nanowires. A patternable dielectric dummy gate(s) is formed over the recessed BOX and surrounding a portion of each of the nanowires. A CMP stop layer is deposited over the dummy gate(s) and the source and drain regions. A dielectric film is deposited over the CMP stop layer. The dielectric film is planarized using CMP to expose the dummy gate(s). The dummy gate(s) is at least partially removed so as to release the nanowires in a channel region. The dummy gate(s) is replaced with a gate conductor material.

19 Claims, 9 Drawing Sheets

(51) Int. Cl.
*B82Y 10/00* (2011.01)
*H01L 29/423* (2006.01)
*H01L 29/66* (2006.01)
*H01L 29/775* (2006.01)
*H01L 29/165* (2006.01)
*H01L 29/78* (2006.01)
*H01L 21/285* (2006.01)

(52) U.S. Cl.
CPC ... *H01L 29/66439* (2013.01); *H01L 29/66545* (2013.01); *H01L 29/66628* (2013.01); *H01L 29/66772* (2013.01); *H01L 29/775* (2013.01); *H01L 29/7831* (2013.01); *H01L 29/78645* (2013.01); *H01L 29/78696* (2013.01); *H01L 21/28518* (2013.01)

(56) References Cited

U.S. PATENT DOCUMENTS

| | | | |
|---|---|---|---|
| 6,355,249 | B2 | 3/2002 | Muir et al. |
| 6,506,673 | B2 | 1/2003 | Ma et al. |
| 6,605,413 | B1 | 8/2003 | Lyons et al. |
| 6,630,710 | B1 | 10/2003 | Augusto |
| 6,855,606 | B2 | 2/2005 | Chen et al. |
| 6,881,645 | B2 | 4/2005 | Ahn et al. |
| 6,897,098 | B2 | 5/2005 | Hareland et al. |
| 6,909,151 | B2 | 6/2005 | Hareland et al. |
| 6,930,035 | B2 | 8/2005 | Sakata |
| 7,267,875 | B2 | 9/2007 | Whiteford et al. |
| 7,279,375 | B2 | 10/2007 | Radosavljevic et al. |
| 7,456,476 | B2 | 11/2008 | Hareland et al. |
| 7,534,675 | B2 | 5/2009 | Bangsaruntip et al. |
| 7,638,842 | B2 | 12/2009 | Currie et al. |
| 7,642,177 | B2 | 1/2010 | Cho |
| 7,820,513 | B2 | 10/2010 | Hareland et al. |
| 7,893,492 | B2 | 2/2011 | Bedell et al. |
| 2002/0063334 | A1 | 5/2002 | Shin et al. |
| 2005/0158935 | A1* | 7/2005 | Shin .................. H01L 21/28114 438/197 |
| 2005/0189583 | A1 | 9/2005 | Kim et al. |
| 2005/0266645 | A1 | 12/2005 | Park |
| 2006/0172497 | A1* | 8/2006 | Hareland .......... H01L 29/42384 438/286 |
| 2008/0017934 | A1 | 1/2008 | Kim et al. |
| 2008/0102586 | A1* | 5/2008 | Park ............................ 438/290 |
| 2008/0277691 | A1 | 11/2008 | Ernst et al. |
| 2008/0308861 | A1* | 12/2008 | Nawaz .......................... 257/327 |
| 2009/0309091 | A1 | 12/2009 | Ishida |
| 2010/0295021 | A1 | 11/2010 | Chang et al. |
| 2011/0012201 | A1 | 1/2011 | Yagishita et al. |

OTHER PUBLICATIONS

P. Hashemi et al., "Fabrication and Characterization of Suspended Uniaxial Tensile Strained-Si Nanowires for Gate-All-Around n-MOSFETs," ECS Transactions, vol. 16, No. 10, pp. 57-68 (2008).

V. Passi et al., "Suspended Silicon-on-Insulator Nanowires for the Fabrication of Quadruple Gate MOSFETs", Nanoscaled Semiconductor-on-Insulator Structures and Devices, vol. 2006, Springer, pp. 89-94 (2007).

M. Guillorn et al., "Hydrogen silsesquioxane-based hybrid electron beam and optical lithography for high density circuit prototyping," J. Vac. Sci. Technol. B vol. 27, pp. 2588-2592 (2009).

S. Bangsaruntip et al., "High Performance and Highly Uniform Gate-All-Around Silicon Nanowire MOSFETs with Wire Size Dependent Scaling," IEDM, Baltimore, MD (2009).

Kuroki et al., "Characterization of Photosensitive Low-k Films Using Electron-Beam Lithography," Electrochem. Soc., 152, G281 (2005), DOI:10.1149/1.1867632.

Kuroki et al., "Photosensitive Porous Low-K Interlayer Dielectric Film," Proc. SPIE 5592, 170 (2005), DOI:10.1117/12.570753.

* cited by examiner

TOP-DOWN VIEW

CROSS-SECTION A1-A2 VIEW

TOP-DOWN VIEW

CROSS-SECTION A1-A2 VIEW

CROSS-SECTION A1-A2 VIEW

TOP-DOWN VIEW

TOP-DOWN VIEW

CROSS-SECTION A1–A2 VIEW

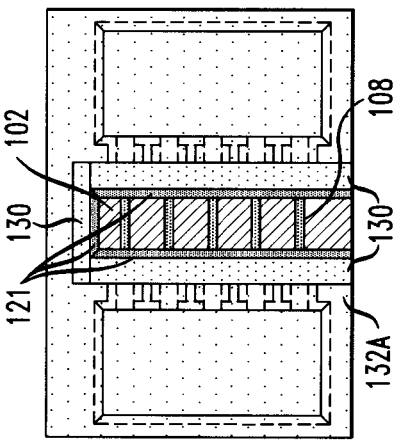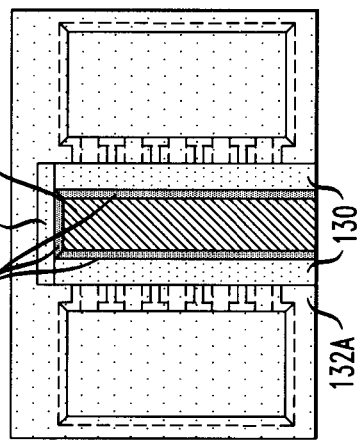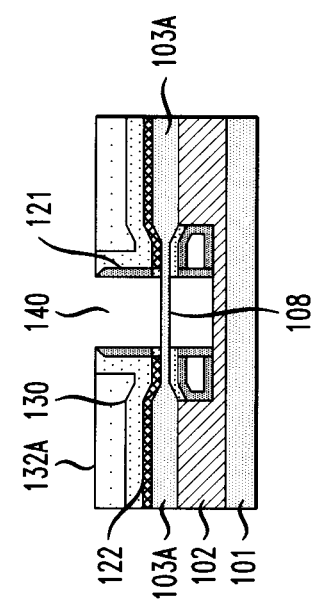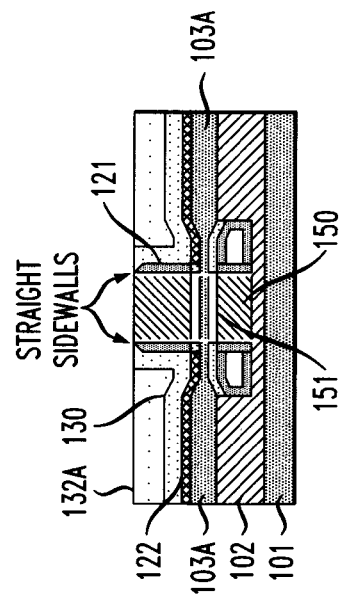

TOP-DOWN VIEW

CROSS-SECTION A1-A2 VIEW

TOP-DOWN VIEW

CROSS-SECTION A1–A2 VIEW

TOP-DOWN VIEW

CROSS-SECTION A1-A2 VIEW

TOP-DOWN VIEW

CROSS-SECTION A1-A2 VIEW

PROCESS FOR FORMING A SURROUNDING GATE FOR A NANOWIRE USING A SACRIFICIAL PATTERNABLE DIELECTRIC

CROSS-REFERENCE TO RELATED APPLICATIONS

This application is a divisional of U.S. application Ser. No. 12/830,514 filed on Jul. 6, 2010, now U.S. Pat. No. 9,029,834, the contents of which are incorporated herein by reference as fully set forth herein.

FIELD OF THE INVENTION

The present invention relates to nanoscale channel-based field effect transistor (FET) devices, such as nanowire FET devices, and more particularly, to techniques for defining a damascene gate in nanowire FET devices that surrounds the nanowire channel by replacing a patterned dielectric with a gate conductor material.

BACKGROUND OF THE INVENTION

The definition of a gate line over non-planar surfaces, and in particular forming a surrounding gate around a cylindrical surface, such as a nanowire channel, is challenging. In this regard, the gate definition process has several important requirements. First, the gate should have the same length (i.e., distance between source and drain regions) as it wraps around the cylindrical channel surface. To achieve uniform gate length, the gate needs to be patterned having straight sidewalls. For example, if the gate sidewalls are sloped then the top surface of the cylindrical channel would be covered by a shorter portion of the gate material as compared with the coverage of the bottom surface of the cylindrical channel. See, for example, S. Bangsaruntip et al., "High Performance and Highly Uniform Gate-All-Around Silicon Nanowire MOSFETs with Wire Size Dependent Scaling," IEDM, Baltimore, Md. (2009) (hereinafter "Bangsaruntip") (FIG. 6(b) illustrates a gate with sloped sidewalls). Second, any gate conductor material outside of the channel region (including underneath the nanowire channels) has to be removed. This requirement is difficult to achieve with conventionally employed directional etching methods such as reactive ion etching (RIE) since the nanowires mask the etching of the gate conductor material underneath the nanowires. Third, the integrity of the nanowires outside of the gate region needs to be preserved during the patterning of the gate.

With regard to the third requirement, suspended nanowires are typically needed to fabricate a surrounding gate. The nanowires can be suspended, for example, by undercutting an insulator (such as a buried oxide (BOX)) below the nanowires. The gate material has to be deposited under the nanowires in order to obtain a surrounding gate. This suggests that to form a gate line one needs to etch past the nanowire and continue etching until the BOX is reached. Thus, during gate definition the etching has to continue even after gate dielectric on top of the nanowires is exposed (to clear the gate material around the nanowires) which can lead to severance of the nanowires due to a finite etch rate of the gate dielectric. Additionally, the gate dielectric is typically made very thin. As a result if the gate dielectric is removed, the nanowire body will be exposed and will also etch. If the etching is stopped once the gate dielectric is exposed, the definition of the gate line all around the nanowire would not be completed. By comparison, with a planar device the etching process can be stopped once the gate conductor material is cleared from the planar surfaces outside of the gate region since the definition of the gate line is complete at this point.

Current gate etching processes produce non-uniform gate lines over the nanowire surfaces, and can lead to severance of small diameter nanowires. Maintaining the integrity of the nanowires during RIE is even more challenging when the gate line is formed over a stacked (multi-layer) nanowire array. The top nanowires are exposed to continuous bombardment of ions until the bottom nanowires in the stack are cleared from the gate conductor material.

Therefore, techniques for forming a gate line with straight sidewalls, while maintaining the integrity of nanowires outside the gate line region, would be desirable.

SUMMARY OF THE INVENTION

The present invention provides techniques for defining a damascene gate in nanowire field-effect transistor (FET) devices that surrounds the nanowire channel by replacing a patterned dielectric with a gate conductor material. In one aspect of the invention, a method of fabricating a FET device is provided. The method includes the following steps. A silicon-on-insulator (SOI) wafer is provided having a SOI layer over a buried oxide (BOX). A plurality of nanowires and pads are patterned in the SOI layer with the pads attached at opposite ends of the nanowires in a ladder-like configuration. The BOX is recessed under the nanowires. At least one dummy gate comprising a patternable dielectric is formed over the recessed BOX and surrounding a portion of each of the nanowires, wherein the portions of the nanowires surrounded by the at least one dummy gate comprise a channel region of the FET and wherein the pads and portions of the nanowires extending out from the at least one dummy gate comprise source and drain regions of the FET. A chemical mechanical polishing (CMP) stop layer is deposited over the at least one dummy gate and over the source and drain regions. A dielectric film is deposited over the CMP stop layer. The dielectric film is planarized using CMP to expose the at least one dummy gate. The at least one dummy gate is at least partially removed so as to release the nanowires in the channel region. The at least one dummy gate is replaced with a gate conductor material.

In another aspect of the invention, another method of fabricating a FET device is provided. The method includes the following steps. A SOI wafer is provided having a SOI layer over a BOX. A stack of alternating layers of silicon germanium and silicon is deposited on the SOI layer. A plurality of fins and pads are patterned in the stack and the SOI layer with the pads attached at opposite ends of the fins in a ladder-like configuration. Portions of the silicon germanium layers from the fins are removed to form a plurality of nanowires in the SOI layer and in each of the silicon layers in the stack. The BOX is recessed under the nanowires. At least one dummy gate comprising a patternable dielectric is formed over the recessed BOX and surrounding a portion of each of the nanowires, wherein the portions of the nanowires surrounded by the at least one dummy gate comprise a channel region of the FET and wherein the pads and portions of the nanowires extending out from the at least one dummy gate comprise source and drain regions of the FET. A CMP stop layer is deposited over the at least one dummy gate and over the source and drain regions. A dielectric film is deposited over the CMP stop layer. The dielectric film is planarized using CMP to expose the at least one dummy gate. The at least one dummy gate is at least partially removed so as to release the nanowires in the channel region. The at least one dummy gate is replaced with a gate conductor material.

In yet another aspect of the invention, a FET device is provided. The FET device includes a SOI wafer having a SOI layer over a BOX; a plurality of nanowires and pads patterned in the SOI layer with the pads attached at opposite ends of the nanowires in a ladder-like configuration, wherein the BOX is recessed under the nanowires; at least one gate over the recessed BOX and surrounding a portion of each of the nanowires, wherein the portions of the nanowires surrounded by the at least one gate comprise a channel region of the FET and wherein the pads and portions of the nanowires extending out from the at least one gate comprise source and drain regions of the FET; a CMP stop layer over the source and drain regions; and a planarized dielectric film over the CMP stop layer.

In still yet another aspect of the invention, another FET device is provided. The FET device includes a SOI wafer having a SOI layer over a BOX; a stack of alternating layers of silicon germanium and silicon on the SOI layer; a plurality of nanowires and pads patterned in the SOI layer and in each of the silicon layers in the stack, wherein the BOX is recessed under the nanowires; at least one gate over the recessed BOX and surrounding a portion of each of the nanowires, wherein the portions of the nanowires surrounded by the at least one gate comprise a channel region of the FET and wherein the pads and portions of the nanowires extending out from the at least one gate comprise source and drain regions of the FET; a CMP stop layer over the source and drain regions; and a planarized dielectric film over the CMP stop layer.

A more complete understanding of the present invention, as well as further features and advantages of the present invention, will be obtained by reference to the following detailed description and drawings.

BRIEF DESCRIPTION OF THE DRAWINGS

FIGS. 9A and B are diagrams illustrating the HSQ dummy gate having been removed according to an embodiment of the present invention;

FIGS. 10A and B are diagrams illustrating a replacement gate having been formed in place of the removed HSQ dummy gate according to an embodiment of the present invention;

DETAILED DESCRIPTION OF PREFERRED EMBODIMENTS

Provided herein are techniques for forming a surrounding gate for a nanoscale channel-based field-effect transistor (FET), such as a nanowire FET, that do not use reactive ion etching (RIE) to define the gate structure. In particular, a sacrificial patternable dielectric combined with a damascene-based process is used to form the gate line therefore avoiding the problems described above. FIG. 1A is a cross-sectional diagram illustrating a starting structure for the process that includes one or more nanowires 104 formed in a silicon-on-insulator (SOI) wafer. A SOI wafer typically includes a SOI layer over a buried oxide (BOX) and a substrate adjacent to a side of the BOX opposite the SOI layer. In the exemplary embodiment shown illustrated in FIG. 1A, a plurality of nanowires 104 with pads 103 attached at opposite ends thereof (see FIG. 1B, described below) have been etched into the SOI layer, e.g., using conventional lithography and RIE processes. A BOX 102 (e.g., made up of silicon dioxide ($SiO_2$)) and a substrate 101 are present beneath nanowires 104/pads 103.

Nanowires 104 are then suspended or released from BOX 102 by etching to recess BOX 102 under nanowires 104. The result is a recessed BOX 105 over which nanowires 104 form a suspended bridge between SOI pads 103. The recessing of BOX 102 can be achieved with a diluted hydrofluoric (DHF)

etching. The lateral component of this etching undercuts BOX 102 under nanowires 104. Alternatively, the suspension of nanowires 104 may be obtained during an annealing process used to reshape nanowires 104 (see below). The recessed BOX 105 is not limited to the region under nanowires 104. The BOX around the pads is also recessed as shown in FIG. 1A. Only under regions covered by SOI the BOX will not recess (with the exception of the lateral etch that forms a SOI overhang). Accordingly, the oxide visible from a top-down view (see for example FIG. 1B, described below) is recessed BOX. For ease and clarity of depiction, however, in the following figures the image is cropped to an area surrounding the nanowires and pads.

While SOI substrates provide an easy path to define and suspend nanowires 104, it is possible to obtain suspended nanowires using other substrates. By way of example only, a silicon germanium (SiGe)/Si film stack epitaxially grown on a bulk Si wafer (not shown) can also be patterned to form nanowires. The SiGe layer can be used as a sacrificial layer (analogous to BOX 102) which is undercut to suspend the nanowires. The implementation of this alternate embodiment would be apparent to one of skill in the art. Additionally, stacked (multi-layer) nanowires can be obtained by epitaxially growing alternating layers of SiGe and Si over a bulk Si wafer or a SOI wafer as will be described in detail below.

Figure 1B:
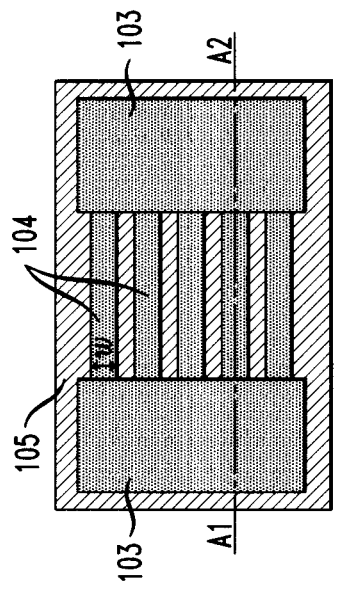
FIGS. 1A and B are diagrams illustrating a starting structure for a field-effect transistor (FET) device fabrication process that includes one or more nanowires and pads formed in a silicon-on-insulator (SOI) wafer over a buried oxide (BOX) which is recessed under the nanowires according to an embodiment of the present invention.
Figure 1A:
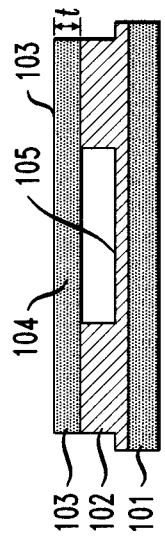

FIG. 1B is a diagram illustrating another perspective, i.e., a top-down view, of the structure of FIG. 1A. As shown in FIG. 1B, nanowires 104 and pads 103 have a ladder-like configuration, i.e., with the nanowires connecting the pads much like rungs of a ladder. At this point in the process, each of the nanowires 104 has a rectangular cross-section that is set by the nanowire width w and the SOI layer thickness t (see FIG. 1A).

Figure 2B:
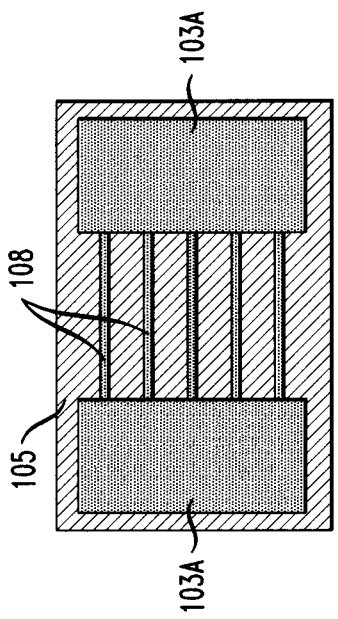
FIGS. 2A and B are diagrams illustrating the nanowires having been reshaped according to an embodiment of the present invention.
Figure 2A:
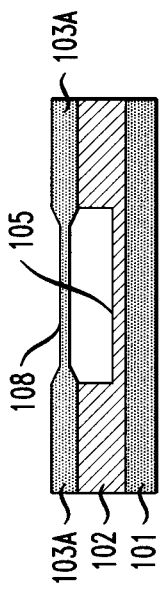

FIG. 2A is a cross-sectional diagram illustrating nanowires 104 having been reshaped to form reshaped nanowires 108. Here, the reshaping refers to a smoothing of the surfaces of nanowires 104 to thereby change their respective cross-sections to be more cylindrical, and to a thinning of the nanowires (as shown in FIG. 2A) by moving Si from the nanowire bodies to the SOI pads (now referred to herein after the reshaping process as SOI pads 103A). As an example, reshaped nanowires 108 may be formed by an annealing process during which the SOI wafer is contacted with an inert gas at a temperature, pressure and for a duration that is sufficient to cause Si to migrate from the nanowires to the SOI pads. Here, the term "inert gas" refers to a gas that does not react with Si and can include, but is not limited to, hydrogen ($H_2$), xenon (Xe) and/or helium (He), and potentially others.

While in the exemplary embodiment shown release of the nanowires from the BOX has been achieved by undercutting the BOX using an etch, release of the nanowires from the BOX may also be achieved through the reshaping process. Namely, by giving the nanowires a more cylindrical cross-section, contact area between the nanowires and BOX is minimized. If the nanowires are also thinned then release from the BOX would be achieved.

FIG. 2B is a diagram illustrating another perspective, i.e., a top-down view, of the structure of FIG. 2A. Using the example wherein the wafer is annealed in $H_2$ gas, shortly before $H_2$ annealing, native oxide is etched off from the surfaces of nanowires 104 and SOI pads 103. The annealing in $H_2$ smoothes the nanowire sidewalls and reshapes the nanowire cross-section from a rectangular cross-section to a more cylindrical cross-section. The $H_2$ anneal may also thin the nanowire bodies by re-distributing Si to the SOI pads.

According to an exemplary embodiment, the $H_2$ annealing may be performed with a gas pressure of from about 30 torr to about 1,000 torr, at a temperature of from about 600 degrees Celsius (° C.) to about 1,100° C. and for a duration of from about one minute to about 120 minutes. In general, the rate of Si re-distribution increases with temperature and decreases with an increase in pressure. For a discussion of the nanowire reshaping and thinning process see, for example, U.S. patent application Ser. No. 12/365,623 filed by Bangsaruntip et al., entitled "Maskless Process for Suspending and Thinning Nanowires," the contents of which are incorporated by reference herein.

Figure 3B:
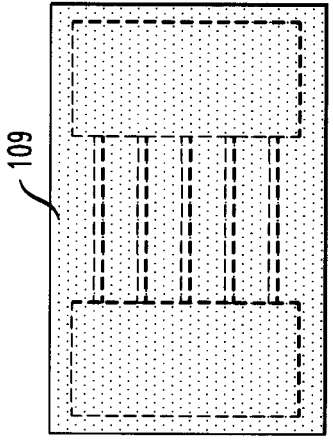
FIGS. 3A and B are diagrams illustrating an hydrogen silsesquioxane (HSQ) film having been blanket deposited over the wafer according to an embodiment of the present invention.
Figure 3A:
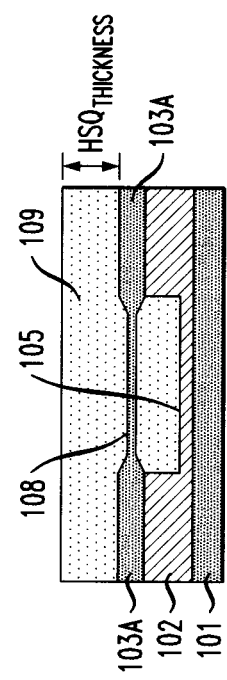

A dummy gate(s) is then formed over the recessed BOX and surrounding the nanowires. The dummy gate formation process begins by first depositing a patternable dielectric. FIG. 3A is a cross-sectional diagram illustrating a patternable dielectric, such as hydrogen silsesquioxane (HSQ) film 109, having been blanket deposited over the wafer using a spin-coating process. HSQ film 109 can be tailored to have a thickness $HSQ_{thickness}$ of from about three nanometers (nm) to about 300 nm. FIG. 3B is a diagram illustrating another perspective, i.e., a top-down view, of the structure of FIG. 3A. Other suitable patternable dielectrics, such as methyl-silsesquioxane (MSQ) may be used in the same manner. See, for example, Kuroki et al., "Characterization of Photosensitive Low-k Films Using Electron-Beam Lithography," Electrochem. Soc., 152, G281 (2005), DOI:10.1149/1.1867632 and Kuroki et al., "Photosensitive Porous Low-K Interlayer Dielectric Film," Proc. SPIE 5592, 170 (2005), DOI:10.1117/12.570753, the contents of each of which are incorporated by reference herein.

Figure 4B:
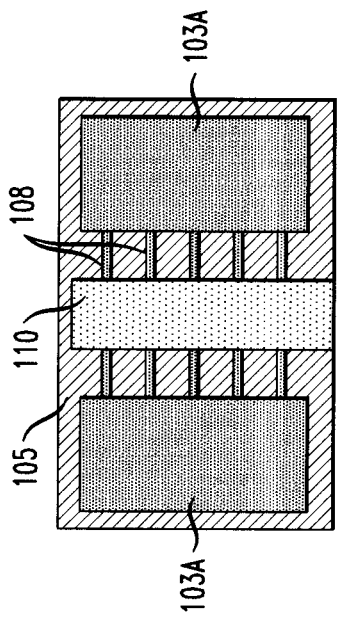
FIGS. 4A and B are diagrams illustrating the HSQ film having been patterned to form an HSQ dummy gate over the recessed BOX and surrounding the reshaped nanowires according to an embodiment of the present invention.
Figure 4A:
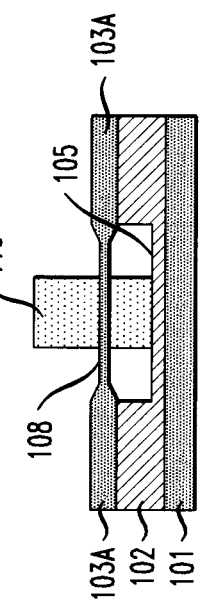

HSQ film 109 is then patterned to form a dummy gate. FIG. 4A is a cross-sectional diagram illustrating HSQ film 109 having been patterned to form HSQ dummy gate 110 over recessed BOX 105 and surrounding reshaped nanowires 108. HSQ film 109 (the patternable dielectric) can be patterned to form dummy gate 110 using, for example, electron-beam (e-beam) lithography or optical lithography. The unexposed portions of HSQ film 109 can be removed by a developer. The term "dummy gate" is being used herein since HSQ dummy gate 110 serves as a sacrificial gate that will be later replaced by a conductive gate material. HSQ dummy gate 110 masks a channel region of the FET (i.e., the portions of the nanowires surrounded by HSQ dummy gate 110), while the exposed (unmasked) regions of nanowires 108 from which the HSQ was removed (and which extend out from the dummy gate) and pads 103A will serve as source and drain regions of the FET.

Once patterned, HSQ dummy gate 110 is hardened by annealing. According to an exemplary embodiment, the dummy gate is annealed at a temperature of about 900° C. in nitrogen ($N_2$) for a duration of 30 minutes. The hardened HSQ dummy gate has properties similar to thermal silicon dioxide ($SiO_2$) (thermal oxide), with a similar etch rate in diluted hydrofluoric acid (HF). As an example, the etch rate of hardened HSQ is from about 2 nanometers per minute to about 3 nm/min in 100:1 diluted HF (which is the same for thermal $SiO_2$). We further note that the hardening of HSQ can also be achieved by UV-curing and by plasma curing, or by a combination of these methods. FIG. 4B is a diagram illustrating another perspective, i.e., a top-down view, of the structure of FIG. 4A.

The wafer is then etched in diluted HF to remove any native oxide from the exposed regions of the nanowires, i.e., in the source and drain regions. According to an exemplary embodiment, the etching includes dipping the structure in 100:1 diluted HF (DHF) (the dilution is done with water ($H_2O$)) for 60 seconds. Due to the hardening anneal, the hardened HSQ dummy gate etches very little (i.e., only about two nanometers (nm) of material is removed from the exposed surfaces of the hardened HSQ dummy gate) during this etch. Thus, the HSQ dummy gate 110 remains intact during this HF dip. If not hardened, the etch rate of spin-coated HSQ in HF is many times faster than that of thermal oxide.

Figure 5A:
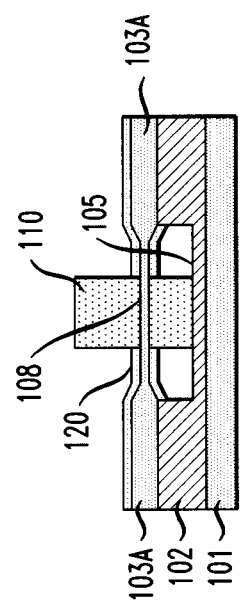
FIGS. 5A and B are diagrams illustrating an epitaxial layer having been selectively grown on the reshaped nanowires and on the pads according to an embodiment of the present invention.
Figure 5B:
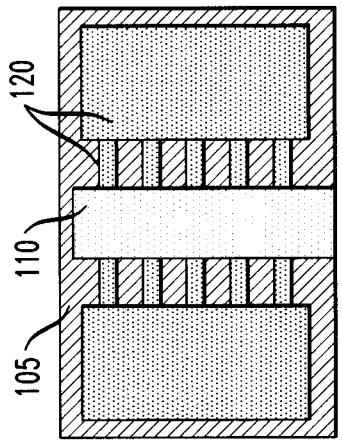

Next, a selective growth of epitaxial Si, Ge or SiGe is performed in the source and drain regions to thicken (or even merge) portions of the nanowires extending out from the dummy gate. Specifically, FIG. 5A is a cross-sectional diagram illustrating an epitaxial layer 120 having been selectively grown on reshaped nanowires 108 and SOI pads 103A. FIG. 5B is a diagram illustrating another perspective, i.e., a top-down view, of the structure of FIG. 5A. As shown in FIGS. 5A and 5B, epitaxial layer 120 forms only over the exposed regions of Si nanowires 108 and SOI pads 103A (including areas of the nanowires 108 and SOI pads 103A exposed by recessed buried oxide 105) due to growth selectivity on Si surfaces.

The epitaxial process used to form epitaxial layer 120 can merge the nanowires into a continuous block of Si, Ge or SiGe. Epitaxial layer 120 can be grown (formed) from a Si or Ge precursor in combination with an epitaxial growth method, such as ultra-high vacuum chemical vapor deposition (UHV-CVD), rapid thermal chemical vapor deposition (RT-CVD) and atomic layer deposition (ALD). Typical Si precursors for example include, but are not limited to, dichlorosilane ($SiH_2Cl_2$), silicon tetrachloride ($SiCl_4$), a mixture of silane ($SiH_4$) and hydrochloric acid (HCl). Growth of SiGe is obtained by co-flowing a Si precursor and a Ge precursor, such as $SiCl_4$ with germane ($GeH_4$). A typical Ge precursor includes, but is not limited to, $GeH_4$. The growth is selective in the sense that deposition of Si, Ge or SiGe takes place only over Si surfaces, but not over dielectric surfaces such as oxides and silicon-nitrides. While selective Si epitaxy typically requires growth temperatures of about 800° C., maintaining selectivity when using lower growth temperatures is possible by adding Ge to the epitaxial layer. With pure Ge growth, the growth temperature can be as low as 300° C. Low temperature growth of SiGe is useful in the case of very thin nanowires as a way to circumvent agglomeration. Agglomeration, which is undesirable, means that the nanowire breaks into balls wherein each ball is formed by collecting the Si material from a segment of the nanowire.

Self-aligned ion-implantation is then used to dope the source and drain regions. The process of self-aligned ion implantation is known to those of skill in the art and thus is not described further herein. For n-type doping, phosphorus (P) and/or arsenic (As) may be used as dopants, and for p-type doping, boron (B) and/or indium (In) may be used as dopants. Rapid thermal annealing (RTA) is used to activate the dopants and anneal out any implant damage. Doping of the source and drain regions may also be obtained by in-situ doping during the epitaxy of epitaxial layer 120. When in-situ doping is used, a boron source such as diborane ($B_2H_6$) is added to the gas mixture to obtain p-type doping, while phosphine ($PH_3$) is used to obtain n-type doping.

Figure 6A:
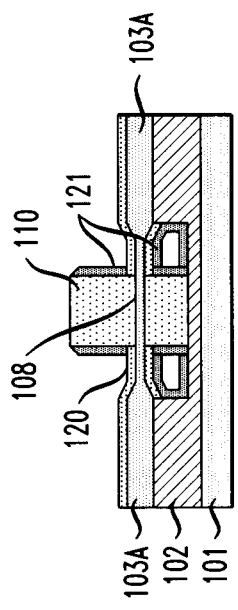
FIGS. 6A and B are diagrams illustrating spacers having been formed on the sidewalls of the HSQ dummy gate according to an embodiment of the present invention.
Figure 6B:
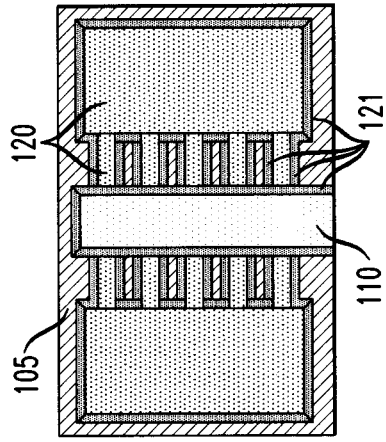

Nitride spacers are then formed on each sidewall of the dummy gate. FIG. 6A is a cross-sectional diagram illustrating spacers 121 having been formed on the sidewalls of the HSQ dummy gate 110. According to an exemplary embodiment, spacers 121 are formed by blanket depositing a silicon nitride ($Si_3N_4$) film over the wafer and etching by RIE to clear the $Si_3N_4$ from all planer surfaces. Due to the directional etching, $Si_3N_4$ will in this example remain under the portions of nanowires 108 extending outside HSQ dummy gate 110 (see FIG. 6A). FIG. 6B is a diagram illustrating another perspective, i.e., a top-down view, of the structure of FIG. 6A.

Figure 7B:
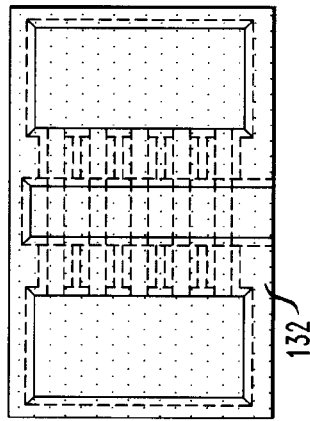
FIGS. 7A and B are diagrams illustrating a self-aligned silicide, germanide or germanosilicide having been formed and a chemical mechanical polishing (CMP) stop layer and a thick dielectric film having been deposited according to an embodiment of the present invention.
Figure 7A:
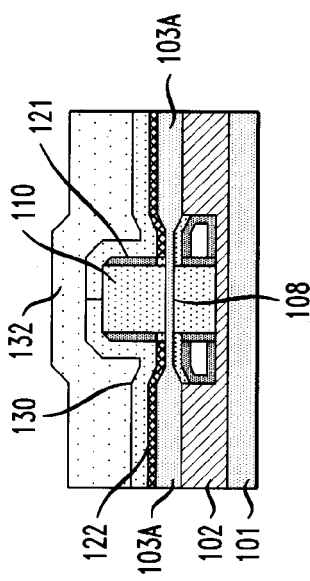

A self-aligned silicide, germanide or germanosilicide (if epitaxial layer 120 includes Si, Ge or SiGe, respectively, see description of FIG. 5A, above) is then formed over the source and drain regions. FIG. 7A is a cross-sectional diagram illustrating a self-aligned silicide, germanide or germanosilicide 122 having been formed over the source and drain regions. More specifically, at least one metal, such as nickel (Ni), platinum (Pt), cobalt (Co) and/or titanium (Ti), is blanket deposited over the wafer. The assembly is annealed to allow the metal to react with the exposed Si, Ge or SiGe over the source and drain regions. The metal over non-Si, -Ge or -SiGe surfaces (e.g., the metal over spacers 121 and HSQ dummy gate 110) remains unreacted. A selective etch is then used to remove the unreacted metal, leaving silicide, germanide or germanosilicide 122 over the source and drain surfaces.

As an example, in the case where Ni is used as the silicide forming metal, the lower resistivity silicide phase is nickel-silicon (NiSi). The NiSi phase forms at an annealing temperature of about 420° C., and the etch chemistry used to remove the unreacted metal is hydrogen peroxide:sulfuric acid ($H_2O_2:H_2SO_4$) 10:1 at 65° C. for 10 minutes. When epitaxial layer 120 also contains Ge (as in $Si_{1-x}Ge_x$ or pure Ge) a germanosilicide or germanide alloy forms.

A planarizing film is then formed over the dummy gate and the source and drain regions. The planarizing film is used to planarize, i.e., to reduce the surface topography. See FIG. 7A. According to an exemplary embodiment, a chemical mechanical polishing (CMP) stop layer 130 (e.g., a silicon nitride ($Si_3N_4$) layer) is first deposited over the structure, i.e., over HSQ dummy gate 110, spacers 121 and silicide, germanide or germanosilicide 122. A thick dielectric film 132 is then deposited over CMP stop layer 130. The dielectric film has to be thick enough to allow planarization by CMP. According to an exemplary embodiment, dielectric film 132 is made up of an oxide material and is from about 50 nm to about 300 nm thick. FIG. 7B is a diagram illustrating another perspective, i.e., a top-down view, of the structure of FIG. 7A.

Figure 8B:
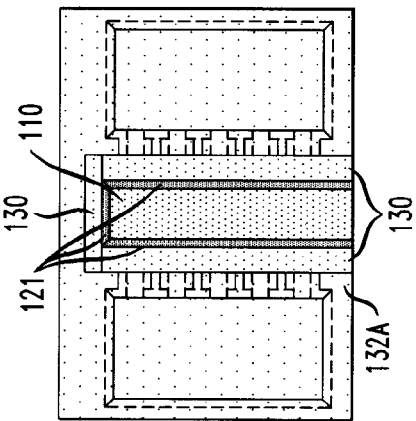
FIGS. 8A and B are diagrams illustrating the device after CMP has been used to planarize the dielectric film, resulting in a planarized dielectric film according to an embodiment of the present invention.
Figure 8A:
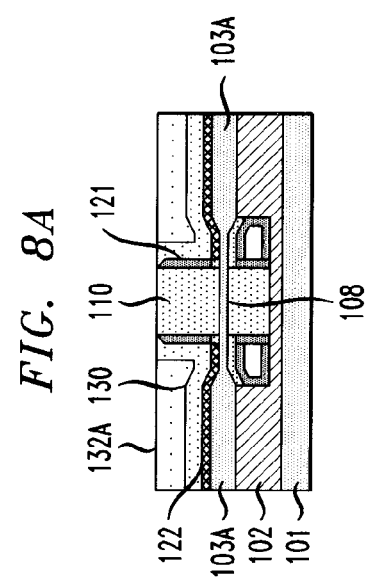

Dielectric film 132 is then planarized. FIG. 8A is a cross-sectional diagram illustrating the device after CMP has been used to planarize dielectric film 132, resulting in a planarized dielectric film 132A. As shown in FIG. 8A, this step also serves to expose a top of HSQ dummy gate 110. It is notable that CMP stop layer 130 (which is not easily polished) allows the polishing pad to "land" on top of HSQ dummy gate 110, with little material being removed from the stop layer by the CMP. After the CMP step, the exposed portion of CMP stop layer 130 topping HSQ dummy gate 110 is removed by a selective etch step, or by an additional CMP step with a different slurry that polishes CMP stop layer 130. FIG. 8B is a diagram illustrating another perspective, i.e., a top-down view, of the structure of FIG. 8A.

The dummy gate is then removed. FIG. 9A is a cross-sectional diagram illustrating the device after HSQ dummy gate 110 has been selectively etched out. The removal of HSQ dummy gate 110 forms a trench 140 and exposes the channel region portion of nanowires 108. FIG. 9B is a diagram illustrating another perspective, i.e., a top-down view, of the structure of FIG. 9A. As can be seen from FIG. 9B, nanowires are exposed in the channel region by the dummy gate removal. The etching (removal) of HSQ dummy gate 110 can be done using DHF (e.g., DHF 100:1) which is selective to nanowires 108 and spacer 121. Etching with DHF will also remove some of the planarized dielectric film 132A if oxide was used for planarization (i.e., if the dielectric film is made up of an oxide material), which will lead to the formation of an undesirable topography. This issue can be overcome as will be described in conjunction with the description of FIGS. 16A-B and 17A-B, below.

A replacement gate is then formed in place of the dummy gate. FIG. 10A is a cross-sectional diagram illustrating a replacement gate 150 having been formed in place of the removed HSQ dummy gate 110. First, however, a conventional deposition process with a suitable gate dielectric material is used to form gate dielectric 151 around the nanowires. By way of example only, gate dielectric 151 can be a thermal oxide or a high-k dielectric such as hafnium oxide ($HfO_2$). A gate conductor material(s) (such as a suitable gate metal, or a combination of a metal gate capped with doped poly-Si) can be deposited over the structure filling trench 140, thus forming replacement gate 150. Any excess gate conductor material outside of trench 140 can be removed by CMP.

As a result of the present fabrication process, replacement gate 150 is formed having substantially straight sidewalls. The term "straight," as used in the context of the gate herein refers to the vertical aspect of the sidewalls. Perfectly straight sidewalls would be perfectly vertical. In FIG. 10A, the straight sidewalls of replacement gate 150 are emphasized using dotted lines. By having straight sidewalls, the replacement gate defines substantially the same channel length in each of the nanowires. Channel length is defined as the distance between the source and the drain. Therefore, the top and bottom of the present gate structure have substantially the same length. This advantage is especially evident in the stacked nanowire configurations described below. Gate length and channel length are correlated as channel length, also the distance between the source and drain regions, is defined by the gate length. For illustrative purposes, by comparison, the gate shown in FIG. 6b of Bangsaruntip (see above) has sloped sidewalls. As was described above, if the gate sidewalls are sloped (i.e., the gate length at the top of the gate is less than the gate length at the bottom of the gate) then the top surface of the nanowires would be covered by a shorter portion of the gate material as compared with the coverage of the bottom surface of the nanowires.

Accordingly, the term 'substantially straight sidewalls' can be quantified based on variation, if any, in the channel length as defined by the gate on any nanowire. For example, with perfectly straight/perfectly vertical sidewalls, there would be no variation in channel length within a given nanowire (i.e., from top-to-bottom as described above) or from one nanowire to another (e.g., in the stacked configuration). Within the context of the present teachings, the sidewalls of the gate are considered to be substantially straight if any resulting variation in the channel length within a given nanowire (i.e., from top-to-bottom as described above) or from one nanowire to another is less than 5 percent (%). FIG. 10B is a diagram illustrating another perspective, i.e., a top-down view, of the structure of FIG. 10A.

It is notable that full removal of HSQ dummy gate 110 is not needed as long as nanowires 108 are released (suspended). Suspending the channel region of nanowires 108 is needed to form a surrounding gate FET. Substantial over etch of HSQ dummy gate 110 is not desirable either as the etching will remove portions of BOX 102. Since the etching is isotropic, extreme over-etching can lead to shorting of two adjacent gates formed on the same nanowire as will be shown in the examples discussed in reference to FIGS. 11A-B and 12A-B, described below. With the formation of the replacement gate, the FET is now complete. Advantageously, since a dummy gate/replacement gate scheme is used with the present techniques, the integrity of the nanowires is preserved during the gate formation process.

Figure 11B:
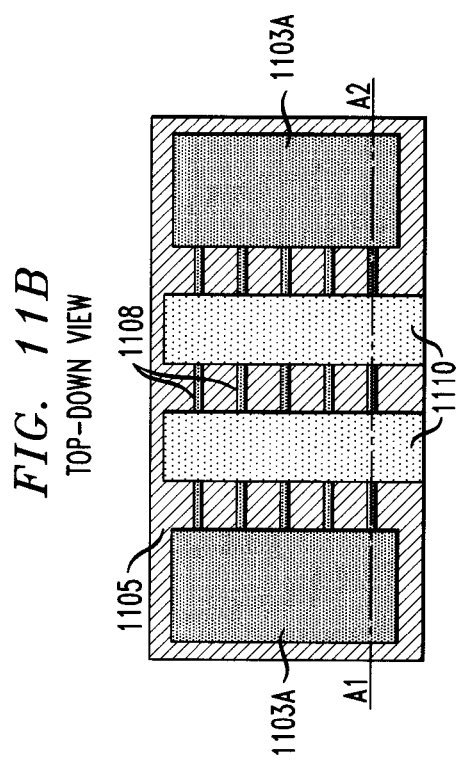
FIGS. 11A and B are diagrams illustrating a FET device having two (dual) HSQ dummy gates according to an embodiment of the present invention.
Figure 11A:
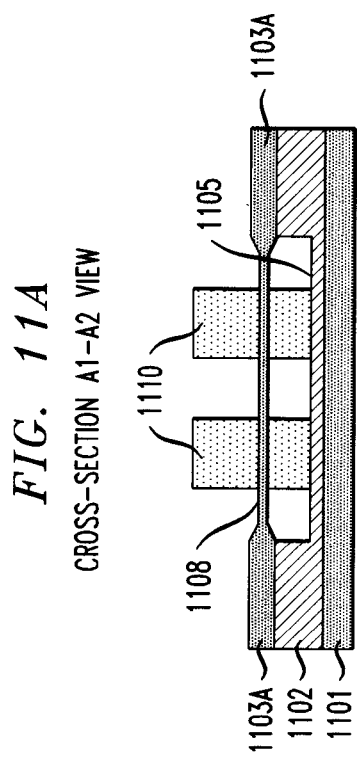

Embodiments are also presented herein where multiple gates are formed on the same nanowires. For example, FIG. 11A is a cross-sectional diagram illustrating a device having two dummy gates. The process flow used to form the structure shown in FIG. 11A is the same as in the case of the single-gate discussed above, except here two dummy gates are formed. Accordingly, the structure shown in FIG. 11A includes a substrate 1101, a BOX 1102 with recessed oxide 1105, reshaped nanowires 1108 and SOI pads 1103A (post nanowire reshaping) and HSQ dummy gates 1110. HSQ dummy gates 1110 can be patterned (e-beam lithography or optical lithography) and hardened (annealed) in the same manner as described above. As with the single gate embodiment above, the patterning of the dummy gates defines the various regions of the device. Namely, the portions of reshaped nanowires surrounded by the HSQ dummy gates will serve as a channel region of the device, while the portions of reshaped nanowires extending out from the HSQ dummy gates and the SOI pads will serve as source and drain regions of the device. FIG. 11B is a diagram illustrating another perspective, i.e., a top-down view, of the structure of FIG. 11A.

Following the same process flow for the single-gate embodiment described above, spacers 1121 are formed on the sidewalls of the HSQ dummy gates, self-aligned silicide, germanide or germanosilicide 1122 is formed over the source and drain regions, a CMP stop layer 1130 is deposited over the structure, a thick dielectric film is deposited over the CMP stop layer and planarized to form planarized dielectric film 1132A, the HSQ dummy gates are removed, a gate dielectric 1151 is formed around the nanowires in the channel region and the HSQ dummy gates are replaced with replacement gates 1150. The details concerning each of these processes were presented above, and are incorporated by reference herein.

Figure 12B:
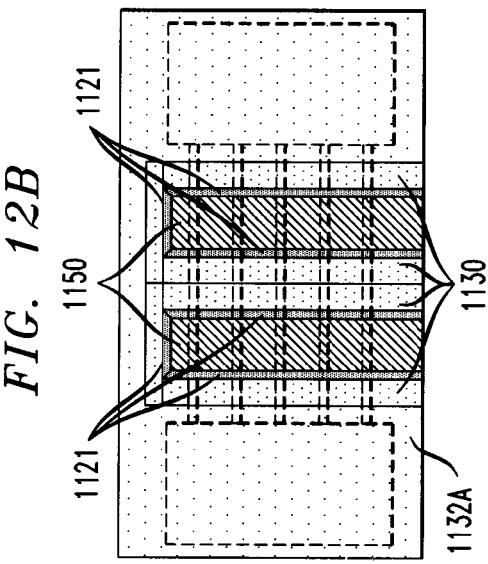
FIGS. 12A and B are diagrams illustrating replacement gates having been formed in place of the dual HSQ dummy gates according to an embodiment of the present invention.
Figure 12A:
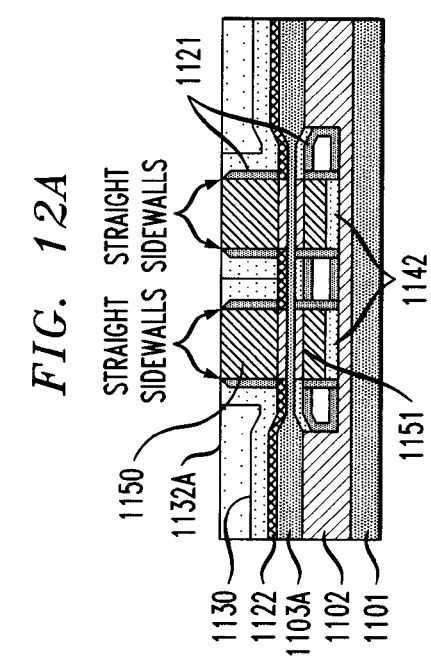

One notable point in this particular embodiment is that while in the case of the single gate full removal of the HSQ dummy gate is optional so long as the nanowires are released (see above), here full removal of the HSQ dummy gate may be undesirable. FIG. 12A is a cross-sectional diagram illustrating replacement gates 1150 having been formed in place of HSQ dummy gates 1110. As shown in FIG. 12A, HSQ dummy gates 1110 are not fully etched, i.e., HSQ dummy gates 1110 are partially etched, to avoid exposure of BOX 1102. Over-etching of the HSQ dummy gates may lead to lateral (sideways) etching of BOX 1102, which could in turn lead to a short of the two adjacent gates. The HSQ is therefore etched enough to release or suspend nanowires 1108, with bottom portions 1142 of HSQ dummy gates 1110 left intact.

As a result of the present fabrication process, replacement gates 1150 are formed having substantially straight sidewalls (see, for example, FIG. 12A). As described above, by having straight sidewalls the replacement gates define substantially the same channel length in each of the nanowires. FIG. 12B is a diagram illustrating another perspective, i.e., a top-down view, of the structure of FIG. 12A.

The present techniques can also be applied to the case of stacked nanowires. Stacked nanowires are used to achieve higher circuit density. In this example, to begin the process, fins and pads made up of alternating layers of SiGe and Si are formed on a SOI wafer. FIG. 13A is a three-dimensional diagram illustrating a starting structure for the stacked nanowire configuration. As shown in FIG. 13A, the SOI wafer includes a substrate 1301, a BOX 1302 and a SOI layer 1303. Alternating layers of SiGe and Si are epitaxially deposited over SOI layer 1303. An SOI wafer is being used merely as an example since the alternating SiGe and Si layers could also be formed, e.g., on a bulk Si wafer. In the current example, SiGe layer 1304 is epitaxially grown over SOI layer 1303, then Si layer 1305 is epitaxially grown over SiGe layer 1304, then a second SiGe layer 1306 is epitaxially grown over Si layer 1305 and finally a second Si layer 1307 is epitaxially grown over SiGe layer 1306. The growth of the stack of SiGe/Si layers 1304 to 1307 can be done in one growth step by alternating the flow of precursors used during deposition. For example, to grow the Si layers, a precursor such as $SiH_4$ is used, while for the growth of SiGe a mixture of $SiH_4$ and $GeH_4$ is used.

Figure 13B:
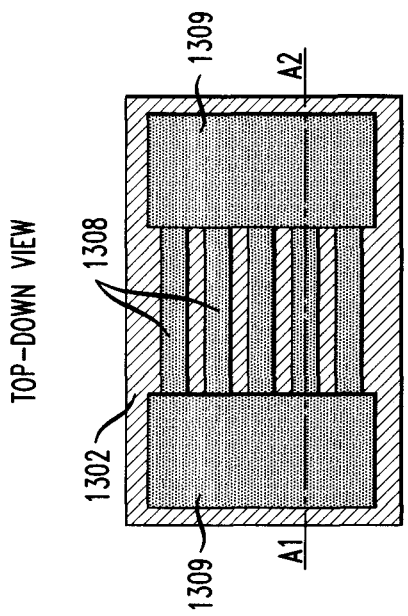
FIGS. 13A and B are diagrams illustrating a starting structure for a FET device with a stacked nanowire configuration having fins and pads made up of alternating layers of silicon germanium (SiGe) and silicon (Si) formed on a SOI wafer according to an embodiment of the present invention.
Figure 13A:
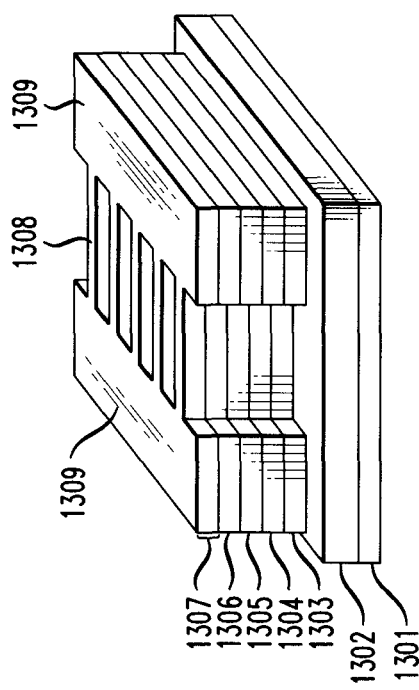

FIG. 13B is a diagram illustrating another perspective, i.e., a top-down view, of the structure of FIG. 13A. In the exemplary embodiment shown illustrated in FIGS. 13A and 13B, a plurality of fins 1308 with pads 1309 attached at opposite ends thereof have been etched into the stack of layers 1303 to 1307, e.g., using conventional lithography and RIE processes. As shown in FIG. 13B, the fins 1308 and pads 1309 have a ladder-like configuration, i.e., with the fins connecting the pads much like rungs of a ladder.

Figure 14B:
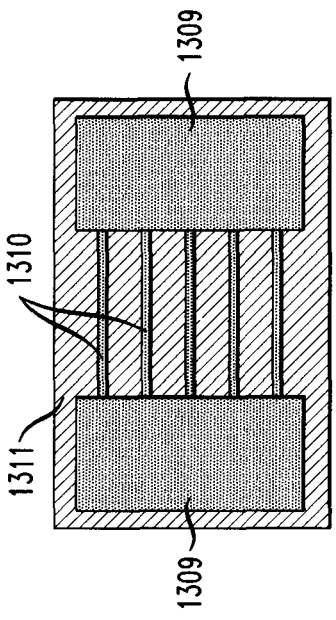
FIGS. 14A and B are diagrams illustrating selective etching of the SiGe having been used to remove the SiGe from the fins thus forming a stack of suspended nanowires according to an embodiment of the present invention.
Figure 14A:
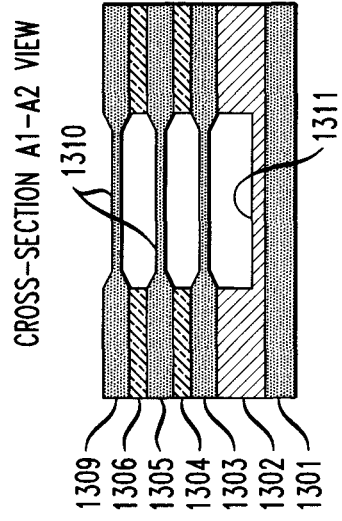
Figure 15B:
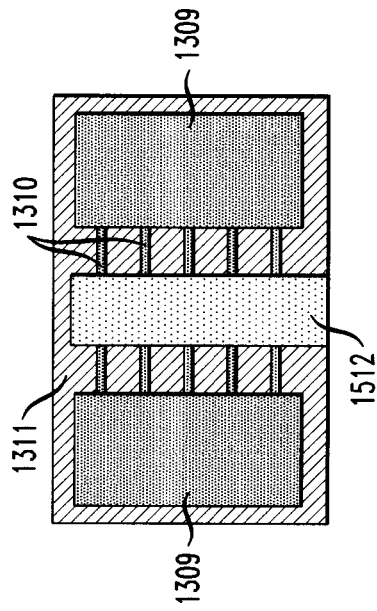
FIGS. 15A and B are diagrams illustrating an HSQ dummy gate having been formed surrounding the stack of nanowires according to an embodiment of the present invention.
FIGS. 15C and D are diagrams illustrating the completed FET device having a nanowire stack according to an embodiment of the present invention.
Figure 15D:
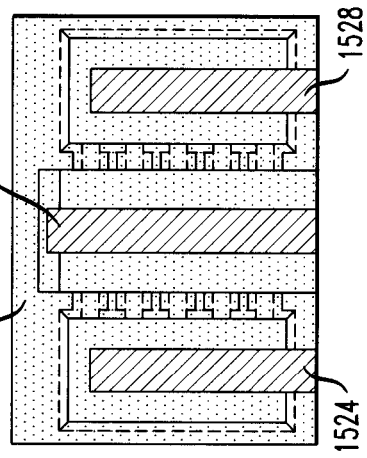
Figure 15A:
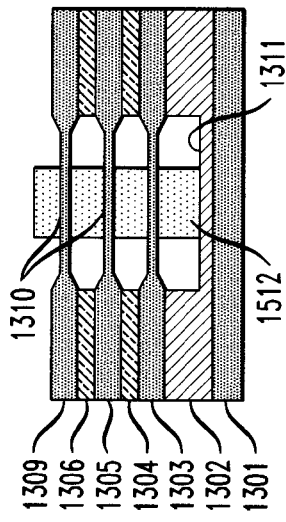

The portions of the SiGe layers in the fins are then removed leaving the portions of the Si layers in the fins to form suspended nanowires. In other words, after etching and removal of the SiGe from the fins each Si layer in the stack (including the SOI layer) has a ladder-like pad-nanowire configuration patterned therein like that shown, for example, in FIG. 13B. Vertically, the pad-nanowire "ladders" are separated from one another by the SiGe remaining in the "pad" areas. FIG. 14A is a cross-sectional diagram illustrating selective etching of SiGe having been used to form a stack of suspended nanowires 1310. As an example, hot gaseous HCL etching can be used to etch SiGe. The etching is followed by an inert gas annealing (such as $H_2$ annealing) to reshape and smooth nanowires 1310 (as was described in detail above). Similar to the case of a single-layer of nanowires, BOX 1302 can be recessed using DHF, resulting in recessed BOX 1311. Alternatively, a wet etch of $1HF:2H_2O_2:3CH_3COOH$ (hydrofluoric acid, hydrogen peroxide and acetic acid) can be used to selectively etch SiGe with respect to Si. FIG. 14B is a diagram illustrating another perspective, i.e., a top-down view, of the structure of FIG. 14A. FIG. 15A is a cross-sectional diagram illustrating an HSQ dummy gate 1512 having been formed surrounding the stack of nanowires. HSQ dummy gate 1512 can be patterned (e-beam lithography or optical lithography) and hardened (annealed) in the same manner as described above. As with the embodiments above, the patterning of the dummy gate defines the various regions of the device. Namely, the portions of reshaped nanowires 1310 surrounded by the HSQ dummy gate will serve as a channel region of the device, while the portions of reshaped nanowires 1310 extending out from the HSQ dummy gate and the pads will serve as source and drain regions of the device. In this configuration, the pads in the layers together form collective source and drain regions. FIG. 15B is a diagram illustrating another perspective, i.e., a top-down view, of the structure of FIG. 15A.

Figure 15C:
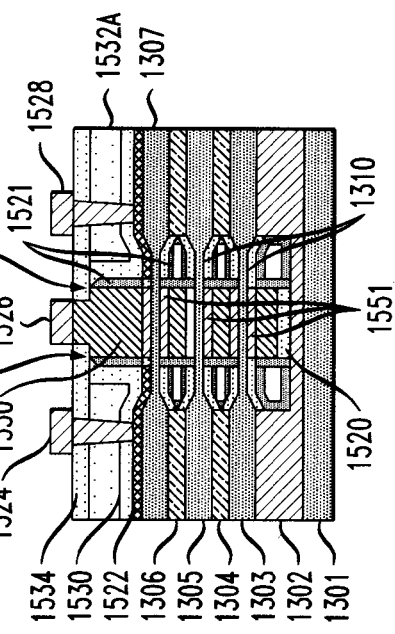

The rest of the process flow remains the same as in the embodiments presented above. Namely, spacers 1521 are formed on the sidewalls of the HSQ dummy gate, self-aligned silicide, germanide or germanosilicide 1522 is formed over the epitaxially thickened source and drain regions, a CMP stop layer 1530 is deposited over the structure, a thick dielectric film is deposited over the CMP stop layer and planarized (to form planarized dielectric film 1532A), the HSQ dummy gate is removed, a gate dielectric 1551 is formed around the nanowires and the HSQ dummy gate is replaced with replacement gate 1550. The details concerning each of these processes were presented above, and are incorporated by reference herein. FIG. 15C is a cross-sectional diagram illustrating the completed device.

As highlighted above, full removal of the HSQ dummy gate is optional so long as the nanowires are released (see above). Thus, as shown in FIG. 15C HSQ dummy gate 1512 is not fully etched to expose BOX 1302. This is done to prevent over-etching of the HSQ dummy gate. The HSQ is therefore etched enough to release or suspend the nanowires, with a bottom portion 1520 of the HSQ dummy gate left intact.

As a result of the present fabrication process, replacement gate 1550 is formed having substantially straight sidewalls. As described above, by having straight sidewalls, the replacement gate defines substantially the same channel length in each of the nanowires. Therefore, the top and bottom of the present gate structure have substantially the same length. This advantage is especially evident with regard to this example involving stacked nanowires. Specifically, if the sidewalls of the gate were sloped, like in conventional devices, then the channel length (defined by the gate length, see above) at the top of the stack would be significantly shorter than the channel length at the bottom of the stack, which is very disadvantageous.

In this embodiment, as with all of the other embodiments described herein, the replacement gate underlaps the pads. Specifically, the replacement gate surrounds each of the nanowires but does not extend over (does not overlap) the pads. Accordingly, as highlighted above, the portions of the nanowires surrounded by the replacement gate will serve as a channel region of the device, while the portions of the nanowires extending out from the replacement gate and the pads will serve as source and drain regions of the device.

The device may be considered complete at this point. However, as was explained above, the etching of the HSQ dummy gate by DHF may also lead to the etching of planarized dielectric 1532A when the dielectric is an oxide. This result is disadvantageous. Therefore, in the particular embodiment shown in FIG. 15C, a second CMP stop layer 1534 is optionally formed on top of planarized dielectric 1532A. Corresponding source contact 1524, gate contact 1526 and drain contact 1528 are also formed. This aspect of the present techniques used to counteract the effects of the dielectric etching during dummy gate removal is described in further detail below. FIG. 15D is a diagram illustrating another perspective, i.e., a top-down view, of the structure of FIG. 15C.

Figure 16B:
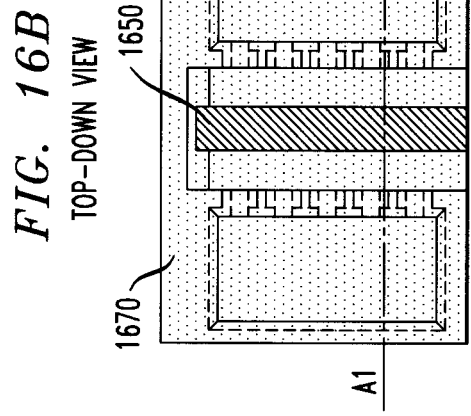
FIGS. 16A and B are diagrams illustrating a FET device having an optional second CMP stop layer according to an embodiment of the present invention.
Figure 16A:
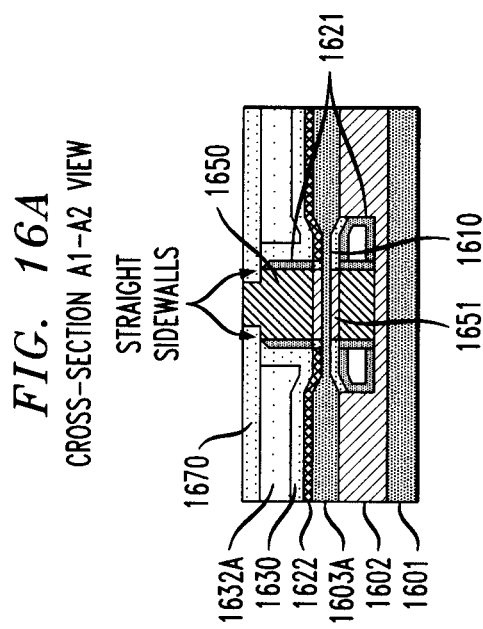

As was explained in reference to FIG. 9A, and elsewhere above, the etching to remove the dummy gate by DHF may also lead to the etching of the planarized dielectric when the dielectric is an oxide. To overcome this issue a second CMP stop layer (e.g. formed of $Si_3N_4$) is used. See, for example, FIG. 16A. FIG. 16A is a cross-sectional diagram illustrating a device, formed according to the present techniques, having an optional second CMP stop layer. Up to the formation of the second CMP stop layer, the process flow remains the same as with the single-gate, single nanowire layer embodiment presented above. Namely, a plurality of nanowires with pads attached at opposite ends thereof are etched into an SOI layer over a BOX 1602 and a substrate 1601. The nanowires are suspended or released from BOX 1602 and then reshaped, to form reshaped nanowires 1610 and SOI pads 1603A. An HSQ dummy gate is formed around the nanowires. Spacers 1621 are formed on the sidewalls of the HSQ dummy gate. Self-aligned silicide, germanide or germanosilicide 1622 is formed over the epitaxially thickened source and drain regions. A CMP stop layer 1630 is deposited over the structure, a thick dielectric film is deposited over the CMP stop layer and planarized to form planarized dielectric film 1632A.

The details concerning each of these processes were presented above, and are incorporated by reference herein.

With this embodiment, however, after planarization of the dielectric film, a second CMP stop layer 1670 is blanket deposited over the structure. Second CMP stop layer 1670 is patterned to expose a top portion of the HSQ dummy gate. The HSQ dummy gate is etched out, a gate dielectric 1651 is formed and the HSQ dummy gate is replaced with replacement gate 1650. The details concerning formation of the gate dielectric and replacing the HSQ dummy gate with a replacement gate were presented above, and are incorporated by reference herein. A second CMP step is used to remove excess gate conductor deposited over the second CMP stop layer 1670. The structure following the second CMP step is shown in FIG. 16A.

As a result of the present fabrication process, replacement gate 1650 is formed having substantially straight sidewalls. As described above, by having straight sidewalls, the replacement gate defines substantially the same channel length in each of the nanowires. Therefore, the top and bottom of the present gate structure have substantially the same length. FIG. 16B is a diagram illustrating another perspective, i.e., a top-down view, of the structure of FIG. 16A.

Figure 17B:
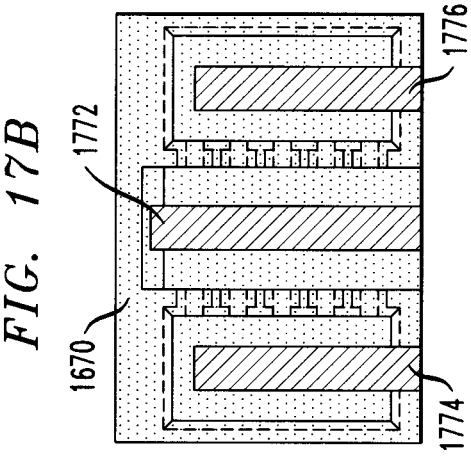
FIGS. 17A and B are diagrams illustrating contacts having been formed to gate and source and drain regions of the FET device of FIGS. 16A and B according to an embodiment of the present invention.
Figure 17A:
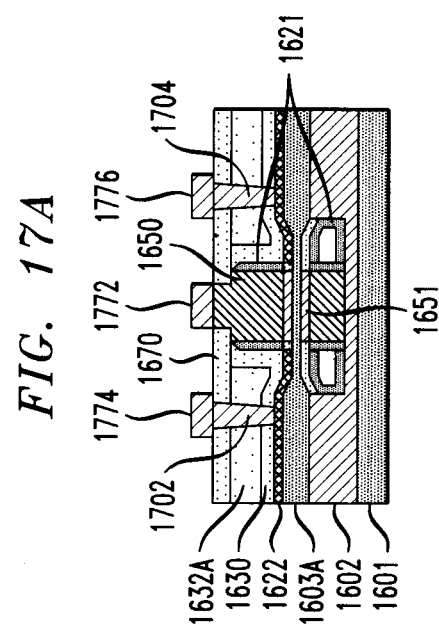

Source and drain contacts are then formed. A gate contact may also be formed. For example, FIG. 17A is a cross-sectional diagram illustrating contacts having been formed to the gate and source and drain regions, respectively. The source and drain contacts are formed by etching a trench (also known as via) through second CMP stop layer 1670, dielectric film 1632A and CMP stop layer 1630 and then filling the trenches with metal such as tungsten to form conductive vias 1702 and 1704. The metal forms a contact to the silicide, germanide or germanosilicide 1622. Metal lines 1774 and 1776 may then be patterned to contact the top portion of the metal in the vias that are connecting to the source and the drain. Since the top portion of the gate is exposed there is no need for a via to access the gate. Accordingly, a metal line 1772 is patterned to contact the gate. FIG. 17B is a diagram illustrating another perspective, i.e., a top-down view, of the structure of FIG. 17A.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field-effect transistor (FET) device, comprising:
  a silicon-on-insulator (SOI) wafer having a SOI layer over a buried oxide (BOX);
  nanowires and pads patterned in the SOI layer with the pads attached at opposite ends of the nanowires in a ladder-like configuration, wherein the BOX is recessed under the nanowires;
  at least one gate over the recessed BOX and surrounding a portion of each of the nanowires, wherein the portions of the nanowires surrounded by the at least one gate comprise a channel region of the FET and wherein the pads and portions of the nanowires extending out from the at least one gate comprise source and drain regions of the FET;
  at least one partial dummy gate present on the BOX below the nanowires and the at least one gate, wherein the at least one gate is present on top of, and has a same footprint as, the at least one partial dummy gate;
  a CMP stop layer over the source and drain regions; and
  a planarized dielectric film over the CMP stop layer.

2. The FET device of claim 1, further comprising:
  a gate dielectric around the nanowires in the channel region.

3. The FET device of claim 1, further comprising:
  spacers on each sidewall of the at least one gate.

4. The FET device of claim 3, wherein the spacers comprise nitride spacers.

5. The FET device of claim 1, further comprising:
  epitaxial silicon, germanium or silicon germanium over the source and drain regions.

6. The FET device of claim 1, wherein the source and drain regions are doped.

7. The FET device of claim 1, further comprising:
  a metal silicide, germanide or germanosilicide over the source and drain regions.

8. The FET device of claim 1, further comprising:
  a second CMP stop layer over the planarized dielectric film; and
  contacts to the source and drain regions that extend through the CMP stop layer, the second CMP stop layer and the planarized dielectric film.

9. The FET device of claim 1, comprising dual gates.

10. The FET device of claim 1, wherein the at least one partial dummy gate comprises hydrogen silsesquioxane and the at least one gate comprises at least one conductor material.

11. A FET device, comprising:
  a SOT wafer having a SOT layer over a BOX;
  a stack of alternating layers of silicon germanium and silicon on the SOT layer;
  a plurality of nanowires and pads patterned in the SOT layer and in each of the silicon layers in the stack, wherein the BOX is recessed under the nanowires;
  at least one gate over the recessed BOX and surrounding a portion of each of the nanowires, wherein the portions of the nanowires surrounded by the at least one gate comprise a channel region of the FET and wherein the pads and portions of the nanowires extending out from the at least one gate comprise source and drain regions of the FET;
  at least one partial dummy gate present on the BOX below the nanowires and the at least one gate, wherein the at least one gate is present on top of, and has a same footprint as, the at least one partial dummy gate;
  a CMP stop layer over the source and drain regions; and
  a planarized dielectric film over the CMP stop layer.

12. The FET device of claim 11, wherein the at least one gate has substantially straight sidewalls.

13. The FET device of claim 11, wherein the at least one gate underlaps the pads.

14. The FET device of claim 11, further comprising:
  a gate dielectric around the nanowires in the channel region.

15. The FET device of claim 11, further comprising:
  spacers on each sidewall of the at least one gate.

16. The FET device of claim 15, wherein the spacers comprise nitride spacers.

17. The FET device of claim 11, further comprising:
  epitaxial silicon, germanium or silicon germanium over the source and drain regions.

18. The FET device of claim 11, wherein the source and drain regions are doped.

19. The FET device of claim 11, further comprising:
  a metal silicide, germanide or germanosilicide over the source and drain regions.

* * * * *